(12) United States Patent
Ding et al.

(10) Patent No.: US 8,106,349 B2
(45) Date of Patent: Jan. 31, 2012

(54) VISION ALIGNMENT WITH MULTIPLE CAMERAS AND COMMON COORDINATE AT CONTACTOR FOR IC DEVICE TESTING HANDLERS

(75) Inventors: Kexiang Ken Ding, San Diego, CA (US); Michel Mabene, San Diego, CA (US); James Frandsen, Romona, CA (US); Yun Tang, San Diego, CA (US); Luis Muller, San Diego, CA (US)

(73) Assignee: Delta Design, Inc., Poway, CA (US)

( * ) Notice: Subject to any disclaimer, the term of this patent is extended or adjusted under 35 U.S.C. 154(b) by 652 days.

(21) Appl. No.: 12/219,106

(22) Filed: Jul. 16, 2008

(65) Prior Publication Data
US 2010/0017161 A1  Jan. 21, 2010

(51) Int. Cl.
*G01P 21/00* (2006.01)
*H01J 40/14* (2006.01)

(52) U.S. Cl. .............. 250/222.1; 250/208.1; 702/94; 348/95

(58) Field of Classification Search ........... 250/221, 250/222.1, 208.1; 348/61, 92, 95, 180, 190; 414/404; 382/145, 151, 276, 293, 294; 702/94; 33/286, 645; 324/750.02, 750.16, 750.18, 324/750.23, 757.01–757.05
See application file for complete search history.

(56) References Cited

U.S. PATENT DOCUMENTS

| | | | | |
|---|---|---|---|---|
| 3,475,805 A * | 11/1969 | Rottmann | ................ | 29/714 |
| 4,894,343 A * | 1/1990 | Tanaka et al. | ........... | 435/285.2 |
| 5,290,134 A * | 3/1994 | Baba | ................ | 414/404 |
| 5,739,525 A * | 4/1998 | Greve | ................ | 250/227.11 |
| 6,640,423 B1 * | 11/2003 | Johnson et al. | ................ | 29/740 |
| 7,049,577 B2 * | 5/2006 | Muller et al. | ................ | 250/221 |
| 7,336,197 B2 * | 2/2008 | Ding et al. | ........... | 340/815.45 |
| 7,506,451 B1 * | 3/2009 | Ding et al. | ................ | 33/286 |
| 7,755,376 B2 * | 7/2010 | Ding | ................ | 324/750.07 |
| 7,842,912 B2 * | 11/2010 | Ding et al. | ................ | 250/222.1 |
| 2002/0181758 A1 * | 12/2002 | Song | ................ | 382/149 |
| 2003/0016352 A1 * | 1/2003 | Goldman et al. | ........... | 356/317 |
| 2003/0188997 A1 * | 10/2003 | Tan et al. | ................ | 209/538 |
| 2004/0062104 A1 * | 4/2004 | Muller et al. | ................ | 365/201 |
| 2004/0165089 A1 * | 8/2004 | An | ................ | 348/246 |
| 2004/0201392 A1 * | 10/2004 | Kim et al. | ................ | 324/758 |
| 2006/0232436 A1 * | 10/2006 | Ding et al. | ........... | 340/815.45 |
| 2007/0080703 A1 * | 4/2007 | Ding | ................ | 324/765 |
| 2007/0185676 A1 * | 8/2007 | Ding et al. | ................ | 702/94 |
| 2009/0289206 A1 * | 11/2009 | Ding et al. | ................ | 250/559.1 |
| 2010/0017161 A1 * | 1/2010 | Ding et al. | ................ | 702/94 |
| 2011/0010122 A1 * | 1/2011 | Ding | ................ | 702/95 |

* cited by examiner

*Primary Examiner* — John Lee
(74) *Attorney, Agent, or Firm* — Foley & Lardner LLP

(57) ABSTRACT

A method and apparatus for aligning a device with a contactor is provided. The apparatus includes a pick and place device, for transporting the device. A first camera acquires an image of the device relative to device holder fiducials of the pick and place device. A second camera detects the location of the contactor relative to fiducials positioned on an alignment frame plate. A third camera to image frame and device holder fiducials to correlate the first and second camera coordinates. Given a processor determines the alignment difference between the device and the contactor. A plurality of actuators align the device with the contactor.

22 Claims, 6 Drawing Sheets

VISION ALIGNMENT WITH MULTIPLE CAMERAS AND COMMON COORDINATE AT CONTACTOR FOR IC DEVICE TESTING HANDLERS

CROSS REFERENCE TO RELATED PATENT APPLICATIONS

U.S. patent application Ser. No. 12/153,780, U.S. patent application Ser. No. 12/153,779 and U.S. patent application Ser. No. 11/525,222 are incorporated by reference herein in their entirety.

FIELD OF THE INVENTION

The present invention relates generally to the field of integrated circuit manufacturing and testing. Specifically, the present invention is directed toward an apparatus and method for aligning a device (e.g., an integrated circuit) with a contactor.

BACKGROUND OF THE INVENTION

The following description of the background of the invention is provided simply as an aid in understanding the invention and is not admitted to describe or constitute prior art to the invention.

Semiconductor devices are subject to numerous tests before they are shipped to a wholesaler and/or end consumer. Manufacturers of semiconductor devices spend a significant amount of time testing devices prior to shipment. Therefore, it is desirable to speed up the semiconductor testing procedure by several methods.

Semiconductor devices are commonly tested using specialized processing equipment. The processing equipment may be used to identify defective products and other various characteristics related to the performance of such devices. In most cases, the processing equipment possesses drives for handling devices under test. In order to insure accurate testing, handling drives must be able to align the device under test correctly with various other testing tools and equipment. Correct alignment of the devices is essential for efficient testing. For example, devices are aligned to, and brought into contact with a contactor for electrically testing the device.

Various systems are used to position and align devices for testing, sorting and other functions. Generally, alignment is achieved using a mechanical alignment system. However, mechanical alignment is only accurate within certain manufacturing ranges and is not ideal for precise alignment operations.

Therefore, an alignment system is needed that can repeatedly align devices using cost-effective and time-efficient procedures.

SUMMARY OF THE INVENTION

It is to be understood that both the foregoing general description and the following detailed description are exemplary and explanatory only, and are not restrictive of the invention as claimed.

According to one embodiment, an apparatus for aligning a device, includes a pick and place device, for transporting the device, a first camera for acquiring an image of the device relative to device holder fiducials of the pick and place device, a contactor for receiving the device, located on an alignment frame plate, a second camera for detecting a location of the contactor relative to fiducials positioned on the alignment plate, a processor for determining the alignment difference between the device and the contactor, and a plurality of actuators, for aligning the device with the contactor.

According to another embodiment, a method for calibrating an aligning device, includes determining a location of a contactor relative to fiducials positioned on an alignment frame plate, aligning a calibration device with the contactor, determining a location of device holder fiducials relative to the fiducials positioned on the alignment frame plate, wherein the device holder fiducials are positioned on a pick and place device holding the device, and storing the location of the contactor relative to the fiducials positioned on an alignment frame plate and storing the location of the device holder fiducials relative to the fiducials positioned on the alignment frame plate as calibration data.

According to still another embodiment, a method for aligning a device, includes acquiring an image of the device relative to device holder fiducials on a pick and place device, determining a position of the device relative to the device holder fiducials, calculating the alignment difference between the device and a contactor and aligning the device with the contactor.

According to yet another embodiment, a device handler for aligning a device, includes a pick and place device, for transporting the device, a first camera for acquiring an image of the device relative to device holder fiducials of the pick and place device, a contactor for receiving the device, located on an alignment frame plate, a second camera for detecting a location of the contactor relative to fiducials positioned on the alignment frame plate, a processor for determining the alignment difference between the device and the contactor, and a plurality of actuators, for aligning the device with the contactor.

BRIEF DESCRIPTION OF THE DRAWINGS

Features, aspects and advantages of the present invention will become apparent from the following description, appended claims, and the accompanying exemplary embodiments shown in the drawings, which are briefly described below.

DETAILED DESCRIPTION

Embodiments of the present invention will be described below with reference to the accompanying drawings. It should be understood that the following description is intended to describe exemplary embodiments of the invention, and not to limit the invention.

Figure 1:
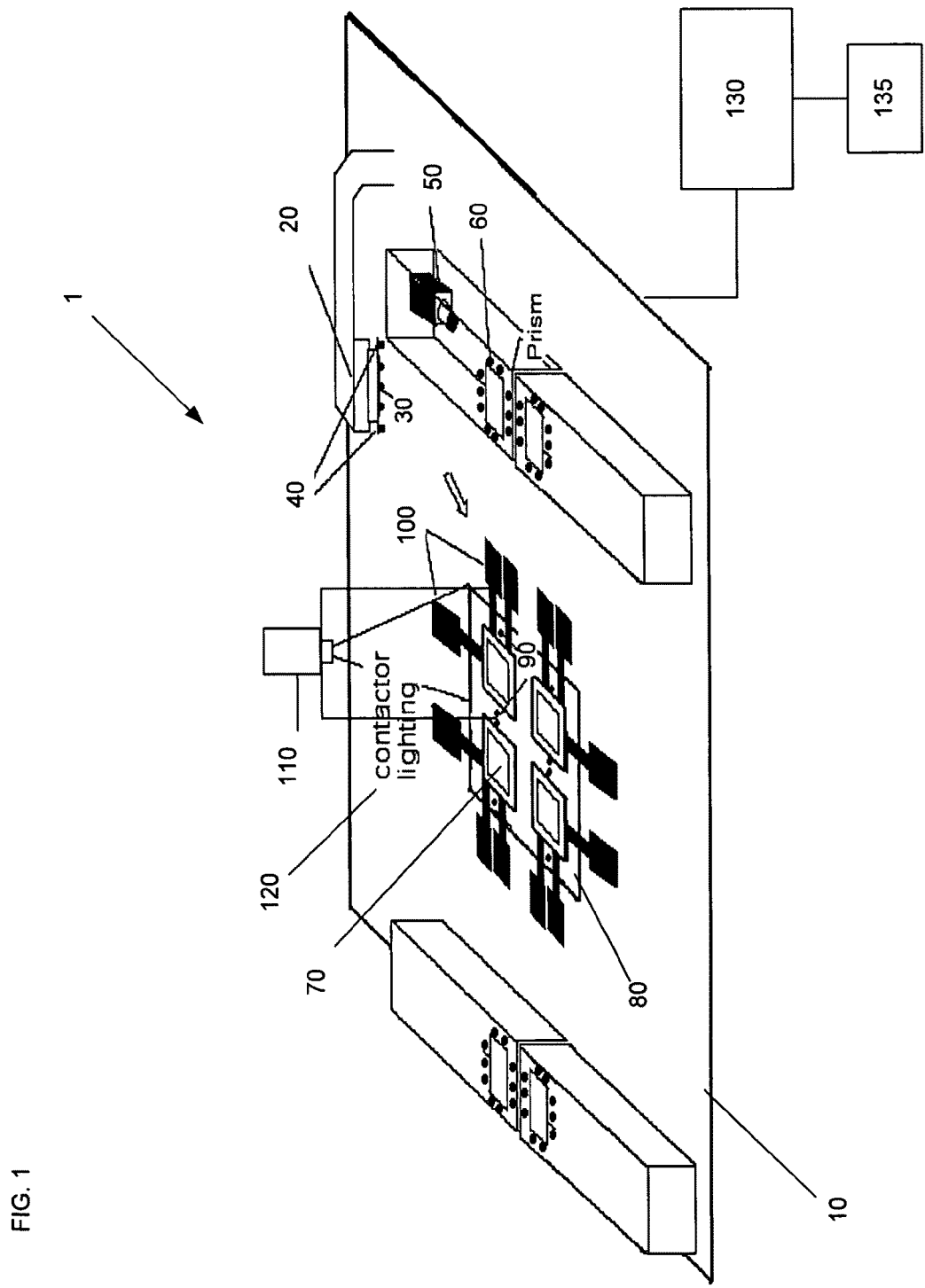
FIG. 1 is a diagram of a vision-alignment system for a device handler, according to one embodiment.
Figure 2:
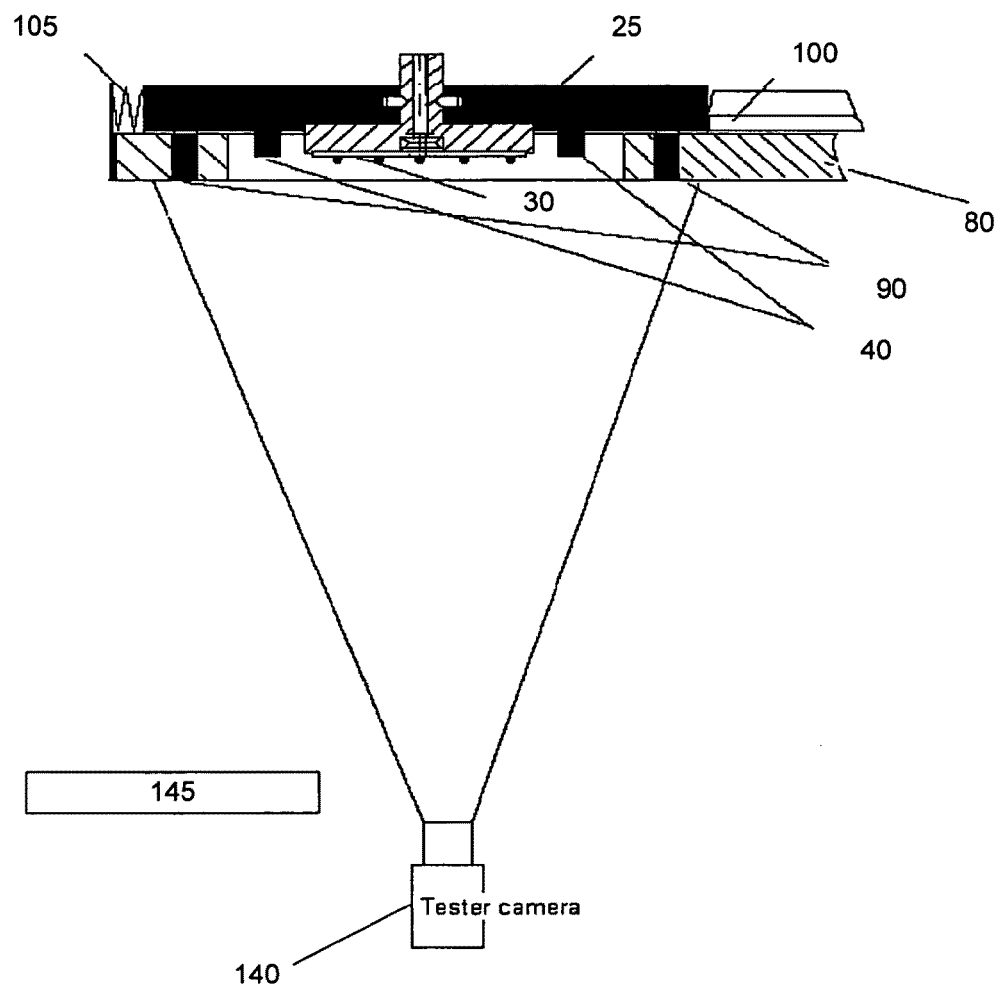
FIG. 2 is a diagram of a device and alignment system being viewed by a tester camera, according to one embodiment.

FIG. 1 and FIG. 2 are block diagrams of a vision alignment system 1 for a device handler 10 according to one embodiment. The vision alignment system 1 includes a pick and place device 20 for transporting a device 30 within the device handler 10. The pick and place device 20 holds the device 30 in a device holder 25. The device holder 25 includes device holder fiducials 40 as reference points for determining the position of the device 30 in the device holder 25.

A device view camera 50 is used to acquire an image of the device 30 in the pick and place device 20, relative to the device holder fiducials 40. A lighting system 60 is positioned in close proximity to the device view camera 50 to provide high contrast lighting on the pick and place device 30. As will be described in further detail below, the device view camera 50, in combination with a processor 130, is configured to detect offset values in the horizontal (x, y) and angular directions of the device 30.

A right angle prism 65 is used to deviate or deflect the line of sight of the device view camera 50 by 90°. This allows the device view camera 50 to acquire an image of the device 30.

The pick and place device 20 can transport a device 30 to a contactor 70 for testing. One or more contactors 70 are positioned at a contactor site on an alignment frame plate 80. A plurality of frame fiducials 90 are positioned on the alignment frame plate 80 as reference points for determining the position of the contactor 70 and the device 30.

A plurality of actuators 100 is attached to each contactor site to correct the position of the device 30. According to one embodiment, three actuators 100 are present at each contactor site. A first actuator 100 corrects the position of a device 30 in a horizontal (x) direction. A second actuator 100 corrects the position of a device 30 in the horizontal (y) direction. A third actuator 100 corrects the position of a device 30 in an angular direction. According to one embodiment, as shown in FIG. 2, in addition to actuators 100, the alignment vision system 1 uses springs 105 to position the device holder 25 in close contact with the actuators 100 so that the device 30 mates correctly with the contactor 70.

A contactor camera 110 is positioned above the alignment frame plate 80. The contactor camera 110 detects the location of the contactor 70 relative to the fiducials 90 positioned on the alignment frame plate 80. A lighting system 120 is positioned in close proximity to the contactor camera 110. A processor 130 is operably connected to the device handler 10 for determining the position difference between the device 30 and the contactor 70 based on the images captured by the device view camera 50 and the contactor camera 110. The processor 130 is operably connected to a memory 135 that stores calibration data and imaging software for execution by the processor 130.

According to another embodiment, as shown in FIG. 2, a tester camera 140 is positioned beneath the alignment frame plate 80. From this position, the tester camera 140 is able to image the position of the device holder fiducials 40 relative to the frame fiducials 90 when the pick and place device 20 plunges a device 30 toward the contactor site. A lighting system 145 is positioned in close proximity to the tester camera 140.

Figure 3:
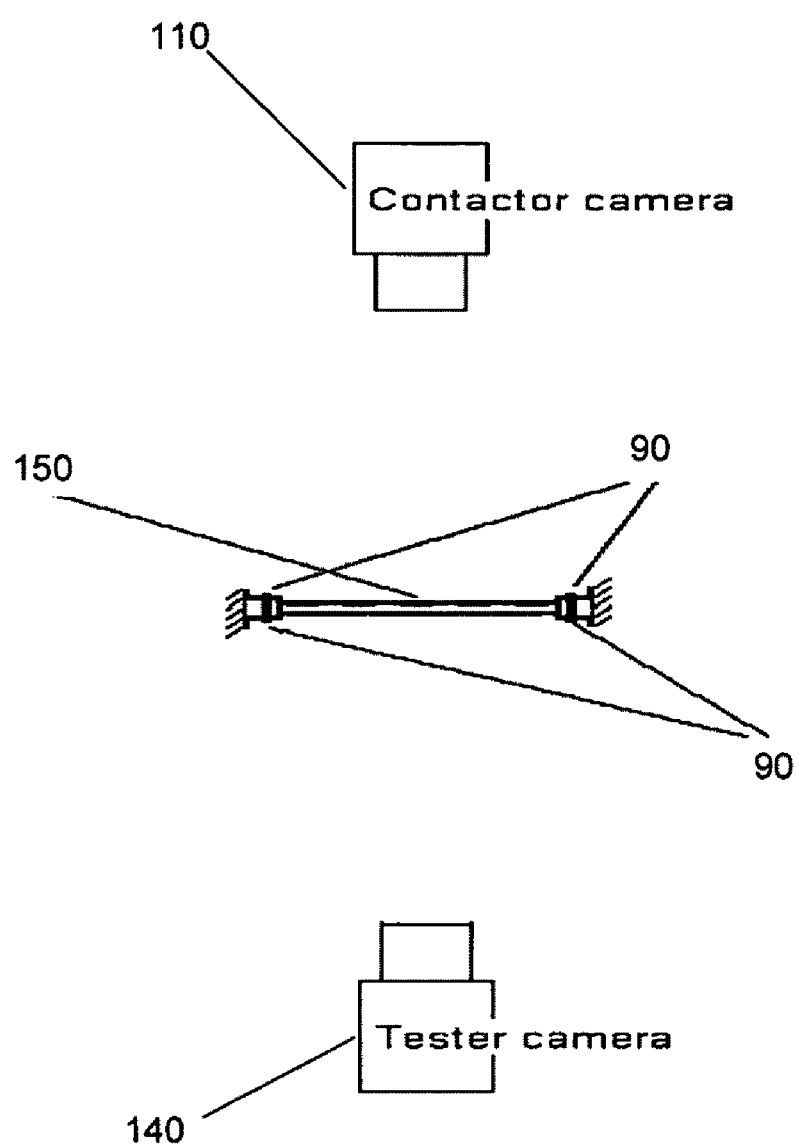
FIG. 3 is a diagram of an alignment frame plate being viewed by a contactor and tester camera, according to one embodiment.
Figure 4:
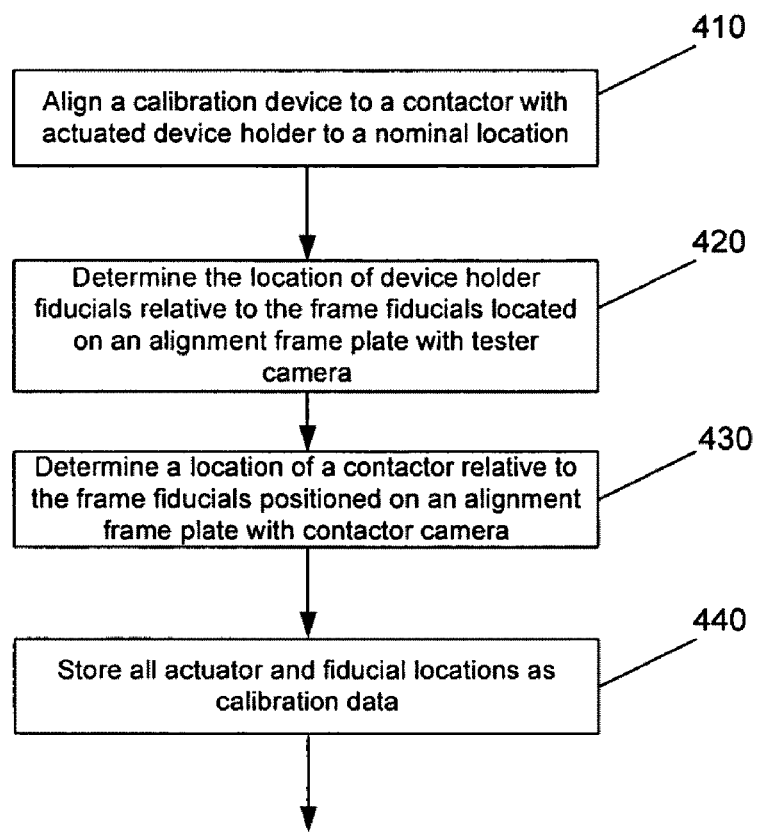
FIG. 4 is a flowchart for calibrating a device handler, according to one embodiment.
Figure 5:
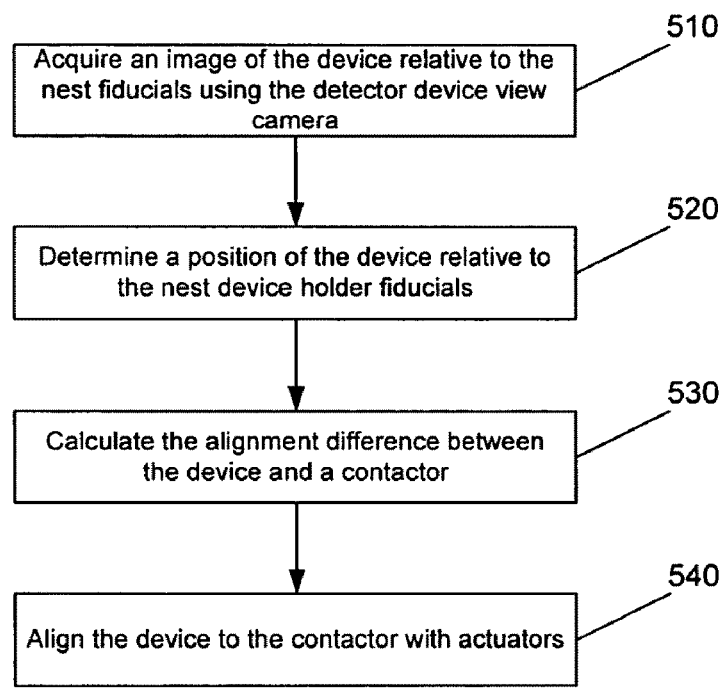
FIG. 5 is a flowchart for aligning a device using a device handler, according to one embodiment.
Figure 6:
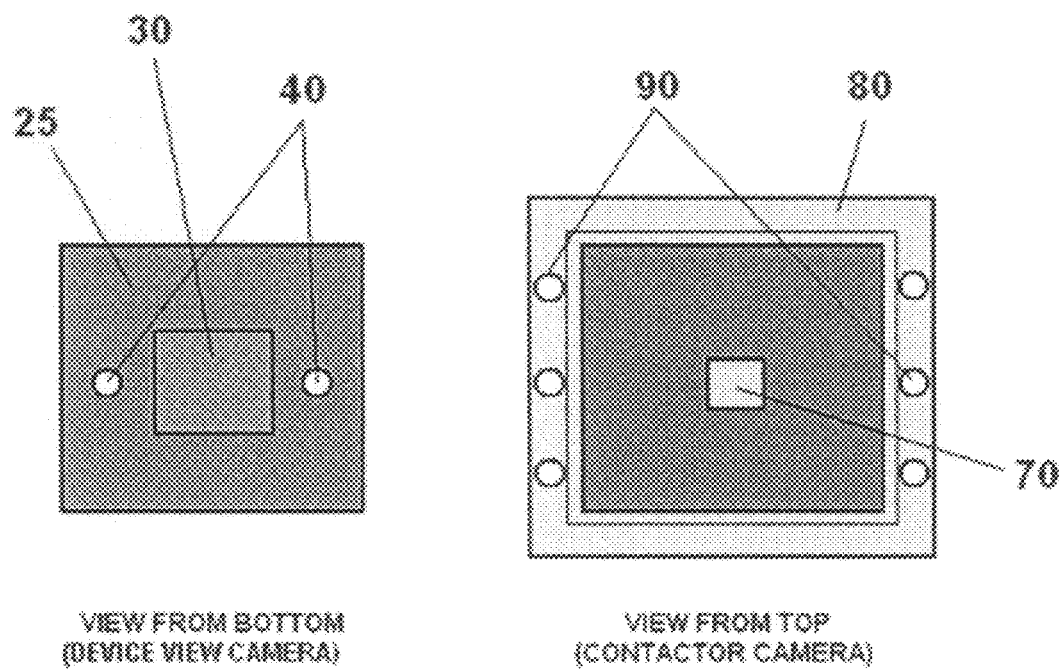
FIG. 6 is a diagram of device and device holder fiducials as viewed by a device view camera, and contactor and frame fiducials as viewed by the contactor camera, according to one embodiment.

FIG. 3 illustrates how the vision alignment system 1 corrects mechanical error during calibration, according to one embodiment. As shown in FIG. 3, the frame fiducials 90 are inserted into the alignment frame plate 80 in such a way that one side of the frame fiducials 90 can be viewed from the top by the contactor camera 110 while the other side of the frame fiducials 90 can be viewed from the bottom by the tester camera 140. To compensate for mechanical errors in the placement of the frame fiducials 90 a transparent calibration target 150 (preferably glass) which can be viewed from the top and bottom by the contactor camera 110 and the tester camera 140, respectively, is positioned on the alignment frame plate 80 and is used by the cameras 110, 140 and the processor 130 to measure the mechanical error during a calibration process. The processor 130 compensates for this mechanical error during runtime.

According to one embodiment, the device view camera 50, calibration camera 110 and tester camera 140 are 659×494 pixel cameras. According to another embodiment, the cameras 50, 110, 140 can be cameras having 659×494 pixels or greater. Each camera 50, 110, 140 can have a lighting system 60. The lighting system 60 allows the cameras 50, 110, 140 to acquire high contrast images. According to one embodiment, the lighting systems 60, 120, 145 are three-channel programmable LED arrays. The angle of the light projected by the lighting systems 60, 120, 145 can be in the range of 0° to 90°.

The calibration of the vision alignment system 1 will now be described with reference to FIGS. 1-4. First, as shown in FIG. 2, the pick and place device 20 plunges a calibration device 30 into a contactor 70. The actuators 100 in conjunction with the spring 105 arrange the device holder 25 of the pick and place device 20 so that the device 30 is arranged in a correct position suitable for calibration (Step 410). The tester camera 140 and the processor 130 are used to determine a location of the device holder fiducials 40 relative to the frame fiducials 90 positioned on the alignment frame plate 80 (Step 420). Next, using the contactor camera 110 and the processor 130, the position of the contactor 70 relative to the frame fiducials 90 positioned on the alignment frame plate 80 is determined (Step 430). Next, the location of the contactor 70 relative to the frame fiducials 90 and the location of the device holder fiducials 40 relative to the frame fiducials 90 and the calibrated actuator locations are stored as calibration data for use during runtime (Step 440).

The operation of the vision alignment system 1 will now be described with reference to FIGS. 1-3 and 5. According to one embodiment, the device view camera 50 acquires an image of a device 30 relative to device holder fiducials 40 on a pick and place device 20 (Step 510). A processor 130 determines the position of the device 30 relative to the device holder fiducials 40 (Step 520).

Next, using the calibration data acquired during the calibration of the vision alignment system 1 (described above) the processor 130 calculates the alignment difference between the device 30 and a contactor 70 (Step 530). Calculating the alignment difference requires acquiring the calibration data concerning the relationship between the device holder fiducials 40 and the frame fiducials 90 and acquiring the calibration data concerning the positional relationship between the frame fiducials 90 and the contactor 70. The above-mentioned calibration data is combined with data concerning the position of the device 30 relative to the device holder fiducials 40 to obtain the alignment difference between the device 30 and the contactor 70. In addition, the processor 130 compensates for mechanical error caused by how the frame fiducials 90 are viewed by the contactor camera 110 and the tester camera 140 using the transparent calibration target 150 shown in FIG. 3.

Using the calculated alignment difference, the actuators 100 align the device 30 with the contactor 70 (Step 540). Specifically, the processor 130 transforms the alignment difference between the device 30 and the contactor 70 to a position offset for each of the plurality of actuators 100. The tips of each of the actuators 100 are positioned relative to the contactor 70. Then, the device 30 is lowered onto the contactor 70 and the actuators 100 guide the device 30 so that it is aligned correctly with the contactor 70. According to another embodiment, the alignment system could be one of a two-point, three-point or group vision alignment system as described in U.S. patent application entitled "Guiding Plate Based Two-Point Vision Alignment for Semiconductor Device Testing Handler," U.S. patent application Ser. No. 12/153,780 entitled "Camera Based Vision Alignment With Device Group Guiding For Semiconductor Device Testing Handlers," Ser. No. 12/153,779 or U.S. patent application Ser. No. 11/525,222, herein incorporated by reference in their entirety.

According to certain aspects of the invention, several advantages are realized. The disclosed apparatus and method corrects the position of a device at the most accurate correction location, which is the contactor site. This eliminates motion that adds positional uncertainties during transportation of the device. In addition, the vision alignment system carries out image processing and actuator correction during the time between the imaging operation of the device view camera and plunging the device into the contactor. To minimize the impact on the machine throughput, the image processing and actuator correction takes place during the period in which the pick and place device transports the device from the device view camera to the contactor. Further, the vision alignment system, via the device view camera, conducts non-stop image acquisition, which also increases the efficiency of the device handler. Moreover, because the contactor location offers more space than is available on a pick and place device, a simpler and more rigid solution for the alignment actuators can be implemented at the contactor site.

The foregoing description of a preferred embodiment of the invention has been presented for purposes of illustration and description. It is not intended to be exhaustive or to limit the invention to the precise form disclosed, and modifications and variations are possible in light of the above teaching or may be acquired from practice of the invention. The embodiment was chosen and described in order to explain the principles of the invention and as a practical application to enable one skilled in the art to utilize the invention in various embodiments and with various modifications as suited to the particular use contemplated. It is intended that the scope of the invention be defined by the claims appended hereto and their equivalents.

What is claimed is:

1. An apparatus for aligning a plurality of devices individually, comprising:
    a device holder with device holder fiducials, said device holder fiducials providing reference points for determining position of the device within the device holder;
    a first camera for acquiring a first image of each device relative to device holder fiducials;
    a pick and place device, for transporting each device from a first location to a contactor on an alignment frame plate, said alignment frame plate including alignment frame fiducials;
    a second camera for acquiring a second image of one side of the device and said alignment frame fiducials;
    a third camera for acquiring a third image of another side of the device and said alignment frame fiducials;
    a processor configured to determine alignment difference between each device and the contactor and location of the device holder fiducials relative to the fiducials positioned on the alignment frame plate, based on said first, second and third images from the first, second and third cameras; and
    a plurality of actuators controlled by said processor, said actuators aligning each device individually with the contactor.

2. The apparatus of claim 1, wherein the first camera and second camera are 659×494 pixel cameras.

3. The apparatus of claim 1, wherein the devices are integrated circuits.

4. The apparatus of claim 1, wherein the contactor is configured to electrically test the devices.

5. The apparatus of claim 1, wherein the processor is configured to execute software for calibrating the apparatus and software for aligning the device with the contactor.

6. The apparatus of claim 1, further comprising a non-volatile hard drive for storing calibration data and a memory that are used by the processor for determining the alignment difference between the device and the contactor.

7. The apparatus of claim 1, wherein the actuators are located in proximity to the contactor.

8. The apparatus of claim 1, wherein the actuators comprise three linear actuators, each actuator for adjusting the alignment of the device in one of the horizontal or angular directions.

9. The apparatus of claim 1, wherein the third camera is a 659×494 pixel camera.

10. The apparatus of claim 1, wherein a transparent plate is placed on the alignment frame plate, the transparent plate being used to measure the mechanical error of the second and third cameras during calibration.

11. The apparatus of claim 1, wherein each of the first, second and third cameras has a lighting device.

12. The apparatus of claim 11, wherein the lighting device is a three-channel programmable LED array.

13. The apparatus of claim 11, wherein the lighting device can project light at an angle in the range of zero to ninety degrees.

14. In a device handler system including a device holder for moving a plurality of devices with a device holder from a first location to a contactor disposed on an alignment frame plate, a method for individually aligning said plurality, comprising:
    obtaining calibration data representing an alignment difference between a device holder and the contactor, said alignment difference obtained by:
        obtaining with a first camera positioned at a first position proximate to said contactor a first image of fiducials on said device holder and fiducials on said alignment frame plate;
        determining the relative position of the device holder fiducials and the fiducials on said alignment frame plate;
        obtaining with a second camera positioned at a second position proximate to said contactor a second image of said contactor and the fiducials on said alignment frame plate; and
        determining said calibration data based on said first and second image;
    acquiring with a third camera a third image of each device relative to device holder fiducials on said device holder;
    determining the position of each device relative to the device holder fiducials based on said first image;
    calculating an alignment difference between each device and the contactor based on said calibration data and the determined position relative to the device holder fiducials; and
    aligning each device with the contactor based on the alignment difference.

15. The method of claim 14, wherein the devices are integrated circuits.

16. The method of claim 14, wherein the contactor is configured to electrically test each device.

17. The method of claim 14, wherein aligning is performed with actuators located in proximity to the contactor.

18. The method of claim 17, wherein the actuators comprise three linear actuators, each actuator for adjusting the alignment of the device in one of the horizontal or angular directions.

19. The method of claim 14, wherein obtaining calibration data further comprises placing a transparent plate on the alignment frame plate.

20. The method of claim 16, wherein each of the first, second and third cameras has a lighting device.

21. The method of claim 20, wherein the lighting device is a three-channel programmable LED array.

22. The method of claim 21, wherein the lighting device can project light at an angle in the range of zero to ninety degrees.

* * * * *